(12) United States Patent  (10) Patent No.: US 10,884,772 B1
Snir et al.  (45) Date of Patent: Jan. 5, 2021

(54) METHOD AND SYSTEM FOR EMULATING AN IMAGE PROCESSING SYSTEM

(71) Applicant: Cadence Design Systems, Inc., San Jose, CA (US)

(72) Inventors: Yafit Snir, Gedera (IL); Roi Sakat, Petach-Tikva (IL); Sanjay Kumar, Bangalore (IN); Abhay Srivastava, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/427,710

(22) Filed: May 31, 2019

(51) Int. Cl.
 *G06F 9/455* (2018.01)
 *G06F 16/11* (2019.01)
 *G06T 1/20* (2006.01)
 *G06T 1/00* (2006.01)

(52) U.S. Cl.
 CPC ............ *G06F 9/455* (2013.01); *G06F 16/116* (2019.01); *G06T 1/0007* (2013.01); *G06T 1/20* (2013.01)

(58) Field of Classification Search
 USPC ........................................................ 716/106
 See application file for complete search history.

(56) References Cited

U.S. PATENT DOCUMENTS

| | | | |
|---|---|---|---|
| 2009/0315899 A1* | 12/2009 | Pourbigharaz | G09G 5/39 345/501 |
| 2013/0275931 A1* | 10/2013 | Moffitt | G06F 30/331 716/106 |
| 2016/0004928 A1* | 1/2016 | Blanchflower | G06F 16/5838 707/741 |
| 2019/0182369 A1* | 6/2019 | Gauvin | H04L 45/72 |

* cited by examiner

*Primary Examiner* — Bryce M Aisaka
(74) *Attorney, Agent, or Firm* — Pearl Cohen Zedek Latzer Baratz LLP

(57) ABSTRACT

A method for emulating an image processing system on an emulator may include pre-processing of image files that comprises converting each of the image files to a file of low-level image data packets; when emulating the image processing system on the emulator, loading each of the files of low-level image data packets to a memory of the emulator; reading the loaded file from the memory and streaming that file of said files of low-level image data packets to the emulated image processing system.

20 Claims, 7 Drawing Sheets

METHOD AND SYSTEM FOR EMULATING AN IMAGE PROCESSING SYSTEM

FIELD OF THE INVENTION

The present invention relates to design verification. More specifically, the present invention relates to system and method for emulating an image processing system on an emulator.

BACKGROUND OF THE INVENTION

Design verification is a common process for testing a newly designed integrated circuit, board, or system-level architecture, to, for example, confirm that it complies with the requirements defined by the specification of the architecture for that device. Design verification for a DUT may be performed on the actual device but can usually be a simulation model of the device is tested.

Verification of electronic designs typically has three forms. At an early stage, before the electronic design is implemented in hardware, simulation can be conducted on a model of the design. Another form can be emulation, in which one electronic hardware is used to mimic the behavior of another (tested) electronic hardware. At more advanced stages of design development, a system on chip can be validated, in a process which is typically referred to as post-silicon validation. Post-silicon validation can be the last stage in the electronic design development, before it is manufactured.

Typically, emulation involves replicating behavior of a hardware device under design using a software environment that is used by manufacturing automation control engineers to validate their programmable logic controller (PLC) files, ladder logic files and human-machine interface (HMI) files before moving to the physical plant environment. An emulation model may typically be in the form of a source code in a hardware development language (HDL, e.g. Verilog).

SUMMARY OF THE INVENTION

There is thus provided, according to some embodiments of the present invention, a method for emulating an image processing system on an emulator. The method may include pre-processing of image files that comprises converting each of the image files to a file of low-level image data packets. The method may also include when emulating the image processing system on the emulator, loading each of the files of low-level image data packets to a memory of the emulator; reading the loaded file from the memory and streaming that file of said files of low-level image data packets to the emulated image processing system.

In some embodiments of the invention, the pre-processing of the image files is performed by software running on a workstation.

In some embodiments of the invention, the software is a simulation computer program.

In some embodiments of the invention, the image files include image files of one or a plurality of image file formats.

In some embodiments of the invention, said one or a plurality of image file formats are selected from the group of image file formats consisting of raster formats or vector formats.

In some embodiments of the invention, the raster formats or vector formats are selected form the group consisting of: RAW, YUV, JPEG, Exif, TIFF, GIF, BMP, PNG, PPM, PGM, PBM, PNM, WebP, HDR, HEIF, BAT, BPG, CGM, Gerber format, and SVG.

In some embodiments of the invention, the loading the files of low-level image data packets to the memory of the emulator, reading each of the files of the low-level image data packets from the memory and streaming the read to the emulated image processing system is performed by a verification IP.

In some embodiments of the invention, the verification IP is an accelerated verification IP.

In some embodiments of the invention, the pre-processing of the image files includes: identifying a file format for an image file of said image files; processing that image file by an engine corresponding to the identified file format; and generating the low-level image data packets for that image file.

In some embodiments of the invention, identifying the file format comprises using a SDL API.

In some embodiments of the invention, the method also includes forwarding the generated low-level image data packets for that image file to RTL memory or to an AVIP.

In some embodiments of the invention, there is provided an emulation image processing system, which includes memory and a processor. The system is configured to: pre-process image files and convert these into low-level image data packets; during on-line testing of the emulated image processing system, load each of the files of low-level image data packets to a memory in the emulator; read low-level image data packets from the memory and stream these low-level image data packets to the emulated image processing system.

In some embodiments of the invention, there is provided a non-transitory computer readable storage medium for emulating an image processing system on an emulator, having stored thereon instructions that when executed by a processor will cause the processor to: pre-process of image files that comprises converting each of the image files to a file of low-level image data packets; during on-line testing of the emulated image processing system, load each of the files of low-level image data packets to a memory of the emulator; read these low-level image data packets from the memory; and stream the low-level image data packets to the emulated image processing system.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention Like components are denoted by like reference numerals.

DETAILED DESCRIPTION OF EMBODIMENTS OF THE INVENTION

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Figure 1:
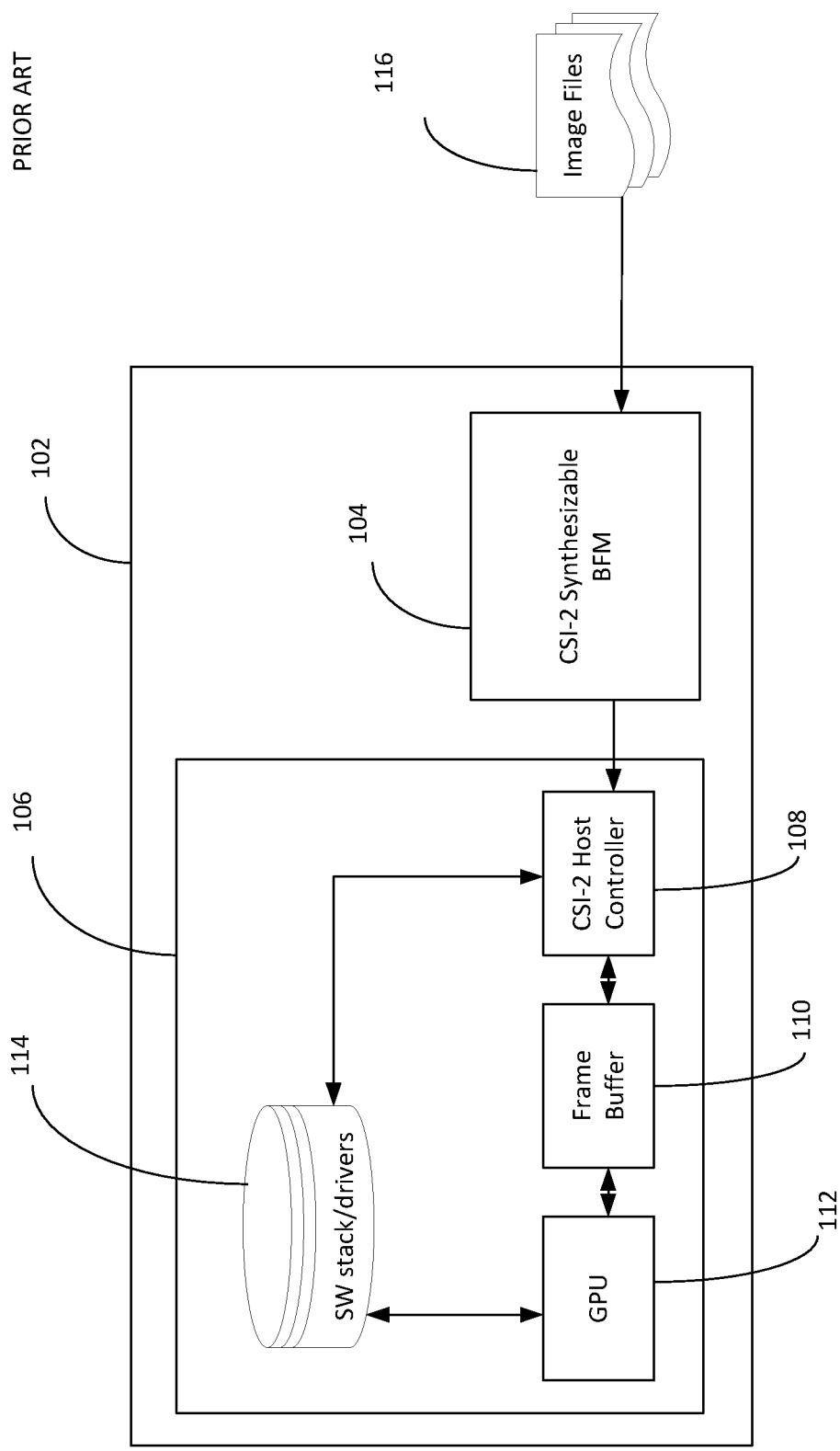
FIG. 1 illustrates online processing of image data on an emulator emulating a system-on-chip (SOC) design, using verification IP (VIP) or accelerated verification IP (AVIP) in the emulator (prior art).

FIG. 1 illustrates online processing of image data on an emulator emulating a system-on-chip (SOC) design, using AVIP in the emulator (prior art).

The embodiment shown in FIG. 1, and related explanation in the specification relates to an emulator testing a SOC design that is configured to use low level image data packets, e.g., Mobile Industry Processor Interface—Camera Serial Interface (MIPI CSI-2—hereinafter "CSI-2" for brevity)— prior art. CSI-2 is a very common camera interface in the mobile industry. For example, each file of the low-level image data packets may include short and/or long packet or packets, header field or fields that may include, for example, type of data, byte data count, virtual channel, error detection and/or correction data (e.g., ECC/CRC), physical layer state, and footer field, e.g., CRC data. Emulator 102 may be used to test a SOC design 106, which may be designed to be a component of an image pipeline (e.g., color image pipeline). The SOC design 106 may include, for example, a CSI-2 host controller 108, frame buffer 110, graphical processing unit (GPU) 112 and data stack/drivers 114, e.g., embodied in software. A CSI-2 compatible synthesizable bus functional model (BFM) 104, which is an example of an accelerated verification IP (AVIP), may be used for relaying image files data 116 to the CSI-2 controller 108 of the SOC design 106. The software side that feeds data to the emulator, may provide a stream of image data mimicking image data stream that would have been provided by an image source (e.g. image data file format, of raster or vector image file formats, such as, for example, RAW, YUV, JPEG, Exif, TIFF, GIF, BMP, PNG, PPM, PGM, PBM, PNM, WebP, HDR, HEIF, BAT, BPG, CGM, Gerber format, and SVG., etc.).

In emulation, there are typically several verification IP (VIP/AVIP) that are designed to provide an interface between hardware (external device/s that are to communicate with the SOC under test) to software (the tested SOC) and vice versa. The CSI-2 compatible synthesizable bus functional model (BFM) 104 is an example of a verification IP, and in this example is designed to transfer image files to the CSI-2 controller 108 of the SOC 106.

In run time, the speed of data streamed from the software side is considerably slower than the speed which may be handled on the hardware side (the emulated SOC), which possess a performance issue, as it slows down the emulation process. This is so because on the software side the image data needs to be converted to CSI-2 data packets, for each image data file that is sent for processing. Typically, this approach may essentially be implemented by using hardware language (e.g., Verilog, System Verilog, etc.).

If the same image file is provided, there may be redundant processing, as for each instance an image file is provided, even if it is an image file that was previously provided, that file undergoes processing and is converted to CSI-2 packets. Implementing image processing on the hardware side may have a high step count, due to the serial nature of the image processing functionality on the hardware. Whenever a new image file format is introduced hardware amendments may be required to facilitate the use of processing of image files of that new file format, which may be complicated and involve unwanted delays.

Figure 2:
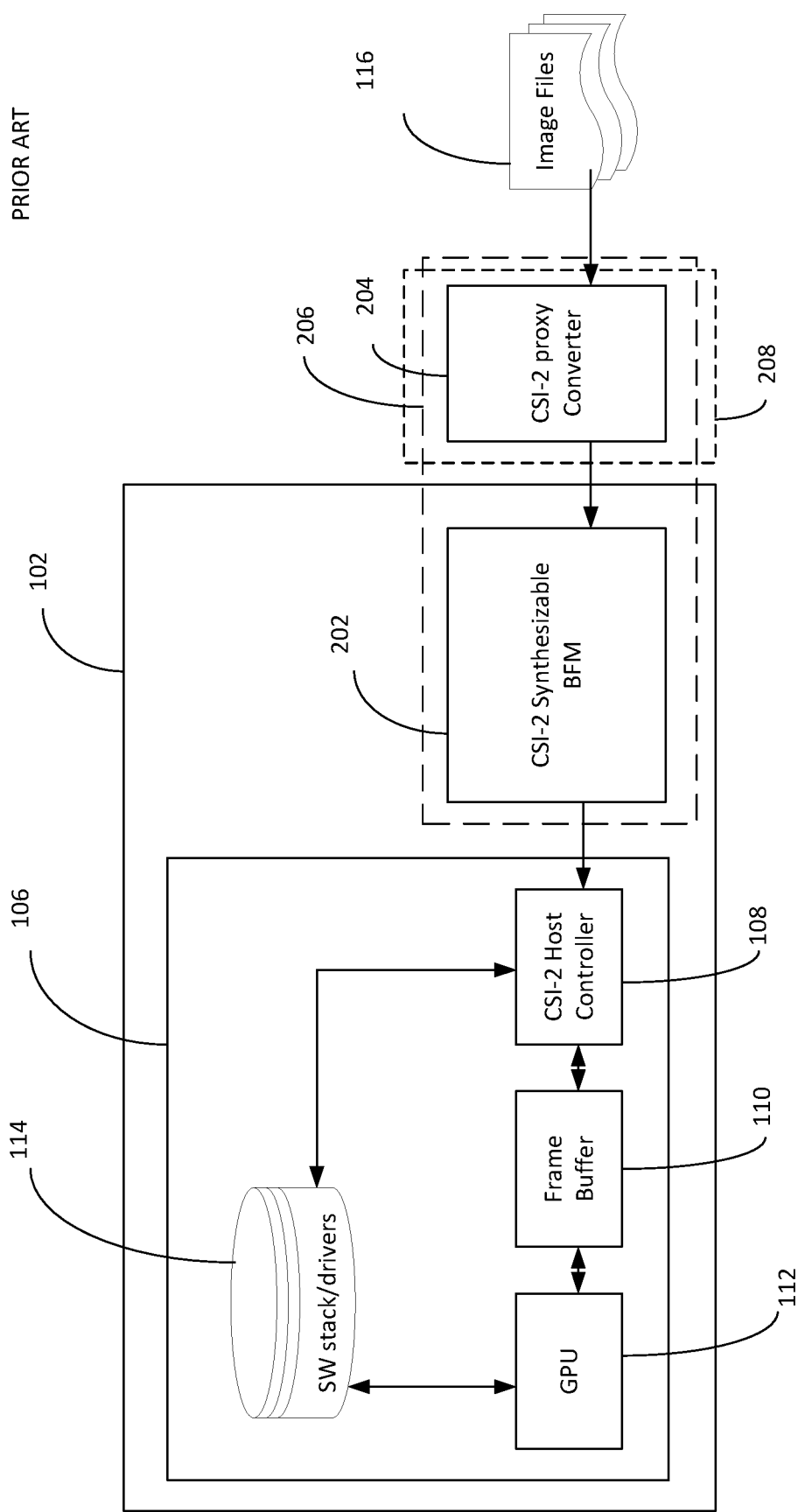
FIG. 2 illustrates online processing of image data on an emulator emulating a system-on-chip (SOC) design, using decentralized VIP/AVIP (prior art).

Another approach is illustrated in FIG. 2 showing online processing of image data on an emulator emulating a system-on-chip (SOC) design, using decentralized AVIP (prior art).

In the embodiment depicted in FIG. 2 the AVIP 206 is decentralized, part of it—CSI-2 proxy converter 204— hosted by a simulator running on a user workstation 208, and another part —CSI-2 synthesizable BFM 202—located on the emulator. The conversion of image files to CSI-2 data packets is carried out by CSI-2 proxy converter 2-4 locally, on the user workstation 208, and the CSI-2 data packets are then transferred to the CSI-2 synthesizable BFM 202. In this approach the speed with which data is transferred is higher than the speed of the setup depicted in FIG. 1, but it has its own drawbacks too. For example, users of in-circuit emulation (ICE) may find this approach more complicated than the approach relating to FIG. 1. ICE users may be required to add a software testbench and migrate their work flow to another tool, for example, an accelerator emulator tool. The conversion of each image file is carried out when that file is provided for transmission through the interface.

Although the overall data transmission speed in the approach illustrated in FIG. 2 may be faster than the data transmission speed in the approach illustrated in FIG. 2, the conversion at the simulator side (the CSI-2 proxy converter running on the user station) still slows down the overall process speed owing to the slower simulator speed compared to the emulator speed.

Some embodiments of the present invention seek to enhance the overall speed of the process of emulation of a SOC requiring image data to be provided by an AVIP.

In some embodiments of the present invention, conversion of image files is carried out off-line, as a pre-processing stage, on a host computer (e.g., workstation) where image files of one or a plurality of image formats (e.g. image data file format, of raster or vector image file formats, such as, for example, RAW, YUV, JPEG, Exif, TIFF, GIF, BMP, PNG, PPM, PGM, PBM, PNM, WebP, HDR, HEIF, BAT, BPG, CGM, Gerber format, and SVG., etc.) may be converted to a batch of low-level image data packets (e.g., CSI-2, SCI, etc.). In some embodiments the low-level image data packets may be organized in files, a file for each converted image file. In some embodiments image files may be converted by a conversion utility to a customized low-level image file containing data packets, for example in a compact format, to save memory and to suit online processing, so as to reduce complexity and processing resources on the BFM side. Each image file may be converted once and saved, so that when online processing is carried out by the emulator, the saved converted image files are loaded during run time to memory on the emulator from which is may be streamed to the CSI-2 host controller, facilitating data streaming that is faster than the data transfer speed on the workstation.

Figure 3:
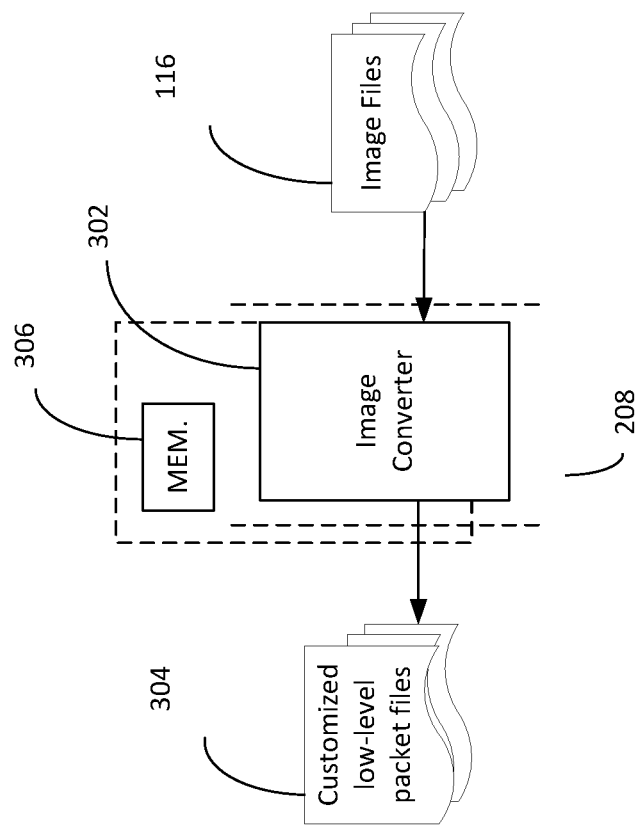
FIG. 3 illustrates the pre-processing offline stage of converting image files to files of low-level image data packets, according to some embodiments of the present invention.

FIG. 3 illustrates the pre-processing offline stage of converting image files to files of low-level image data packets, according to some embodiments of the present invention.

A host computer (e.g., workstation 208) may run a simulation program that includes a converter 302 for converting image files 116 of one or a plurality of image file formats (e.g. image data file format, of raster or vector image file formats, such as, for example, RAW, YUV, JPEG, Exif, TIFF, GIF, BMP, PNG, PPM, PGM, PBM, PNM, WebP, HDR, HEIF, BAT, BPG, CGM, Gerber format, and SVG., etc.) into low-level image data packets 304 (e.g., CSI-2, CSI, etc.). The conversion of the image files may be carried out offline, and the converted image files may be saved (e.g., to memory 306 on workstation 208).

Figure 4:
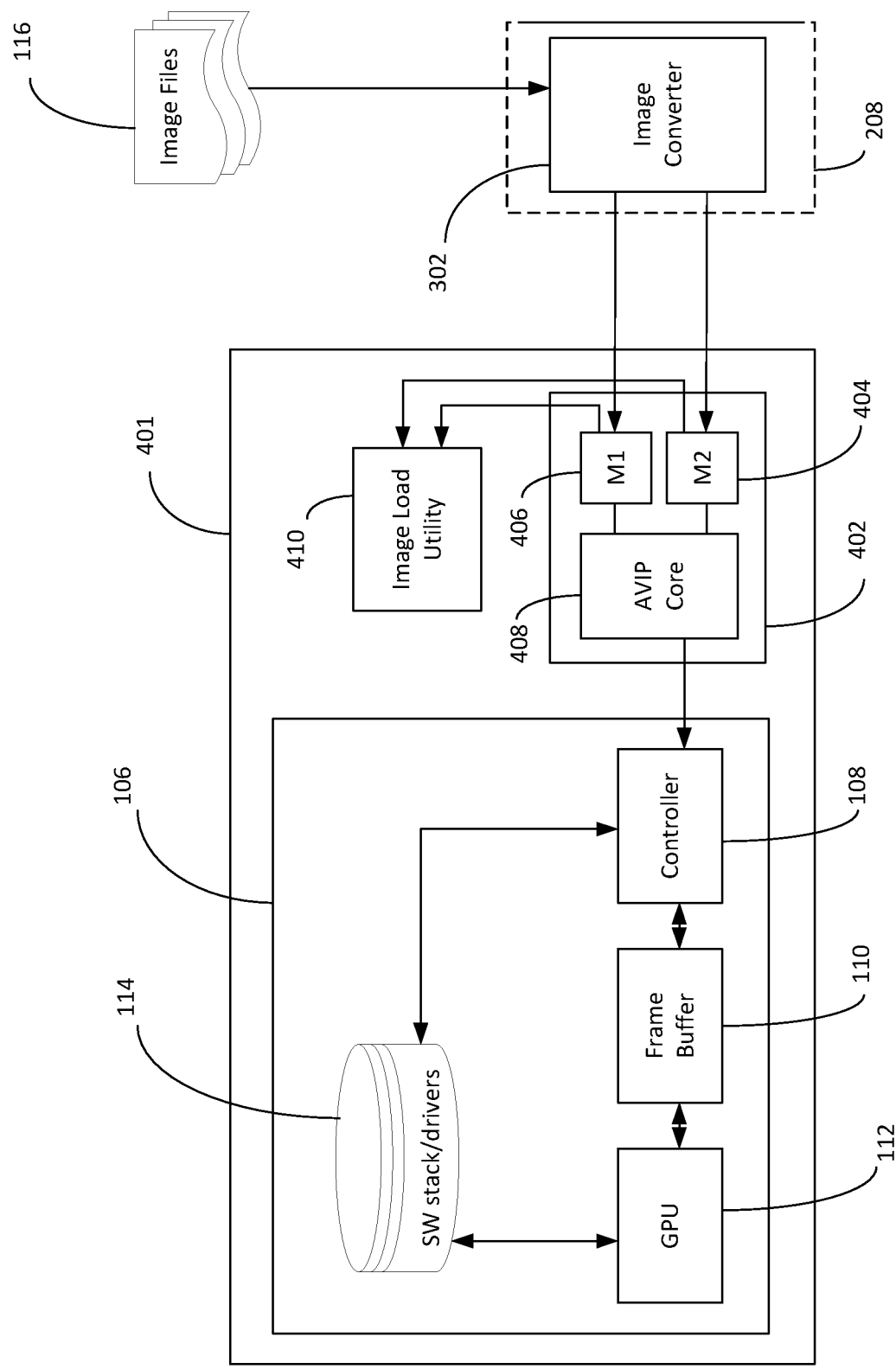
FIG. 4 illustrates processing of image data on an emulator emulating a system-on-chip (SOC) design, using a VIP/AVIP in the emulator, according to some embodiments of the present invention.

FIG. 4 illustrates processing of image data on an emulator emulating a system-on-chip (SOC) design, using a VIP (AVIP) in the emulator, according to some embodiments of the present invention.

A host computer (e.g., workstation 208, may be configured to run an image convertor program 302, (e.g., of a simulator), the image convertor 302 configured to convert image files 116 of one or a plurality of image file formats (e.g. image data file format, of raster or vector image file formats, such as, for example, RAW, YUV, JPEG, Exif, TIFF, GIF, BMP, PNG, PPM, PGM, PBM, PNM, WebP, HDR, HEIF, BAT, BPG, CGM, Gerber format, and SVG., etc.) into low-level image files 304 (e.g., CSI-2, CSI, etc.). The conversion process may be carried out off-line and the converted files may be saved (e.g., in memory or a storage device).

Emulator 401 may include an image processing system 106 that is emulated on the emulator 401 for testing.

Emulator 401 may also include AVIP 402 that includes AVIP core 408 that acts, for example, as a PHY protocol interface (PPI) and one or more memories (in the depicted examples two memories M1 and M2). Memories M1 and M2 may be operably linked to an image load utility 410 that is configured to load (one at a time) the low-level image data packets that are provided by the simulator on the workstation 208. In some embodiments of the present invention allows reading a converted image data file from one of the memories, while concurrently loading another converted image data file, to be read next, so as to increase the speed of transmission of the converted image data packets to the controller 108 of SOC 106.

In some embodiments of the invention a loop mode may be operated, allowing saving to memory converted image data packets and reading them more than once (e.g., a plurality of times), without having to perform conversion more than once., for example for use in performance testing of the emulated SOC 106.

Essentially, the data flows in a unidirectional manner through the VIP/AVIP that acts as an image data interface.

Figure 5:
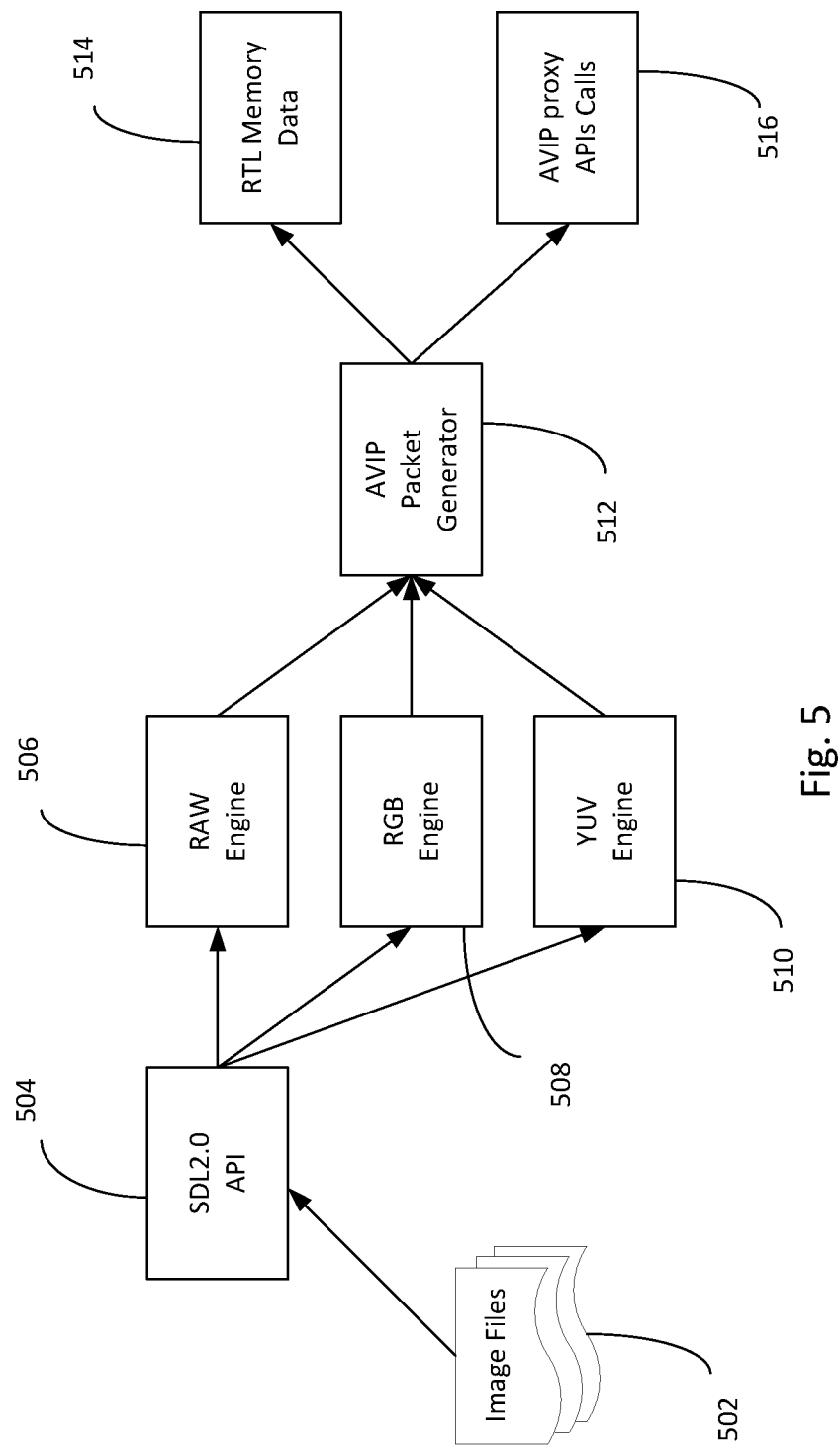
FIG. 5 is a schematic block diagram of a conversion process of image files of one or more image data file formats to files of low-level image data packets, according to some embodiments of the present invention.

FIG. 5 is a schematic block diagram of a conversion process of image files of one or more image data file formats to low-level image data packets, according to some embodiments of the present invention.

Image files 502 of one or more image file formats may be provided to one or a plurality of simple directmedia level (SDL) for example, SDL 2.0, application programming interfaces (APIs), which is configured to identify the file format for each image data file and send it to a corresponding appropriate file format engine, for example RAW engine 506, RGB engine 508, YUV engine 510. The appropriate file format engine then forwards processed image data to AVIP packet generator 512, which is configured to organize the processed image data of each image file into customized files of low-level image data packets.

The customized files of low-level image data packets may then be forwarded to register transfer level (RTL) memory data for saving the converted files for later use, or may be forwarded directly to AVIP proxy APIs for immediate transfer into the emulator for processing by the emulated SOC.

Figure 6:
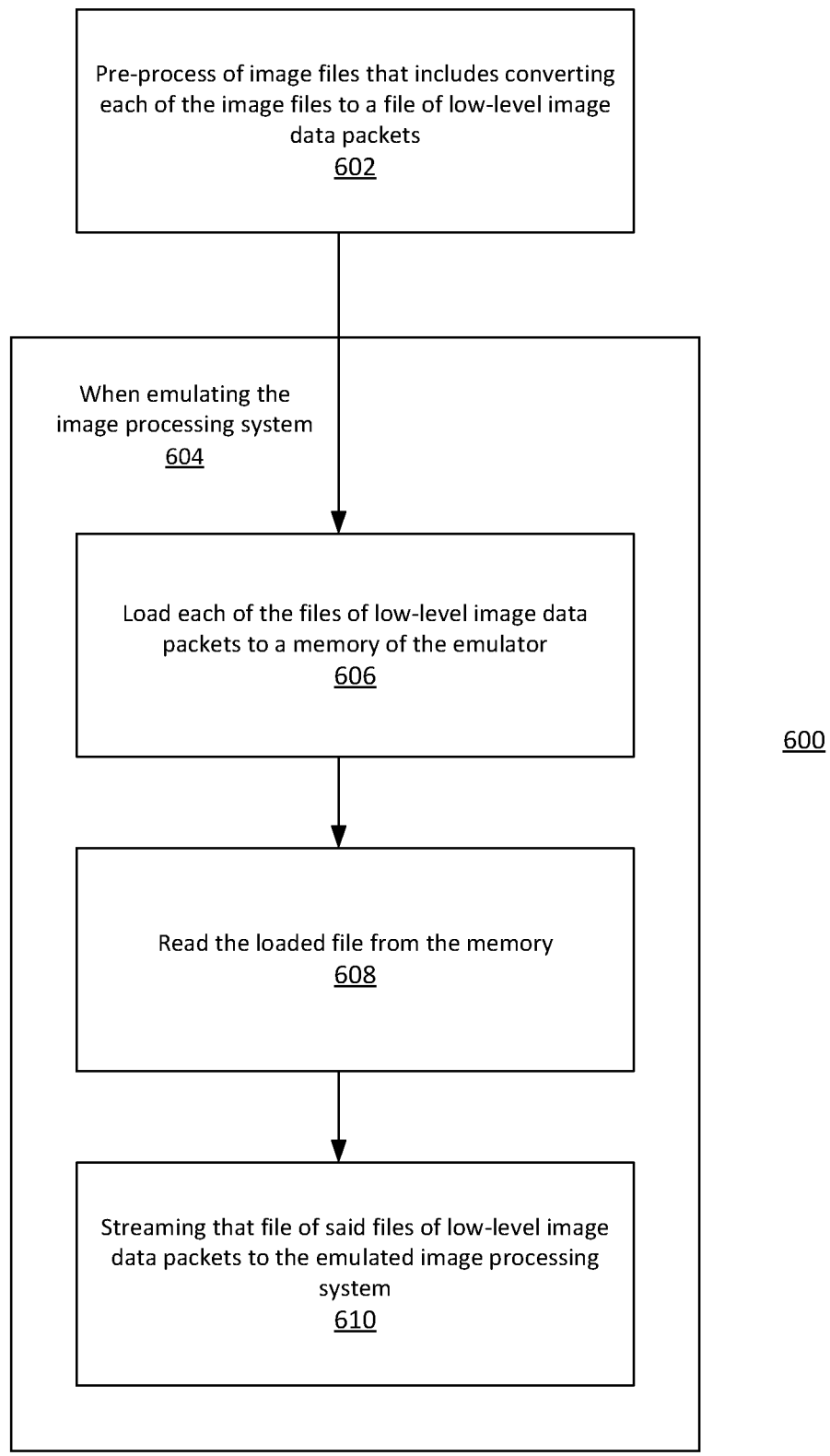
FIG. 6 is a schematic flow chart of a method 600 for emulating an image processing system on an emulator, according to some embodiments of the invention.

FIG. 6 is a schematic flow chart of a method 600 for emulating an image processing system on an emulator, according to some embodiments of the invention.

The method 600 may include pre-processing 602 of image files that comprises converting each of the image files to a file of low-level image data packets. Method 600 may include, when 604 emulating the image processing system on an emulator, loading 606 each of the files of low-level image data packets to a memory of the emulator; reading 608 each of the files of low-level image data packets from the memory; and streaming 610 each of the files of low-level image data packets to the emulated image processing system. The reading of the image files containing low-level image data packets may be done concurrently to the streaming, for example by reading line by line and streaming the read lines, while reading the next line (or lines). In other embodiments the entire file containing low-level image data packets may be read before streaming it but that may slow down the process, which may render concurrent reading and streaming more desired.

In some embodiments of the invention, the pre-processing of the image files is performed by software running on a workstation.

In some embodiments of the invention, the software is a simulation computer program.

In some embodiments of the invention, the image files include image files of one or a plurality of image file formats.

In some embodiments of the invention, the one or a plurality of image file formats are selected from the group of image file formats consisting of raster formats or vector formats.

In some embodiments of the invention, the raster formats or vector formats are selected form the group consisting of: RAW, YUV, JPEG, Exif, TIFF, GIF, BMP, PNG, PPM, PGM, PBM, PNM, WebP, HDR, HEIF, BAT, BPG, CGM, Gerber format, and SVG.

In some embodiments of the invention, the loading the files of low-level image data packets to the memory of the emulator, reading each of the files of the low-level image data packets from the memory and streaming the read to the emulated image processing system is performed by a verification IP.

In some embodiments of the invention, the verification IP is an accelerated verification IP.

Figure 7:
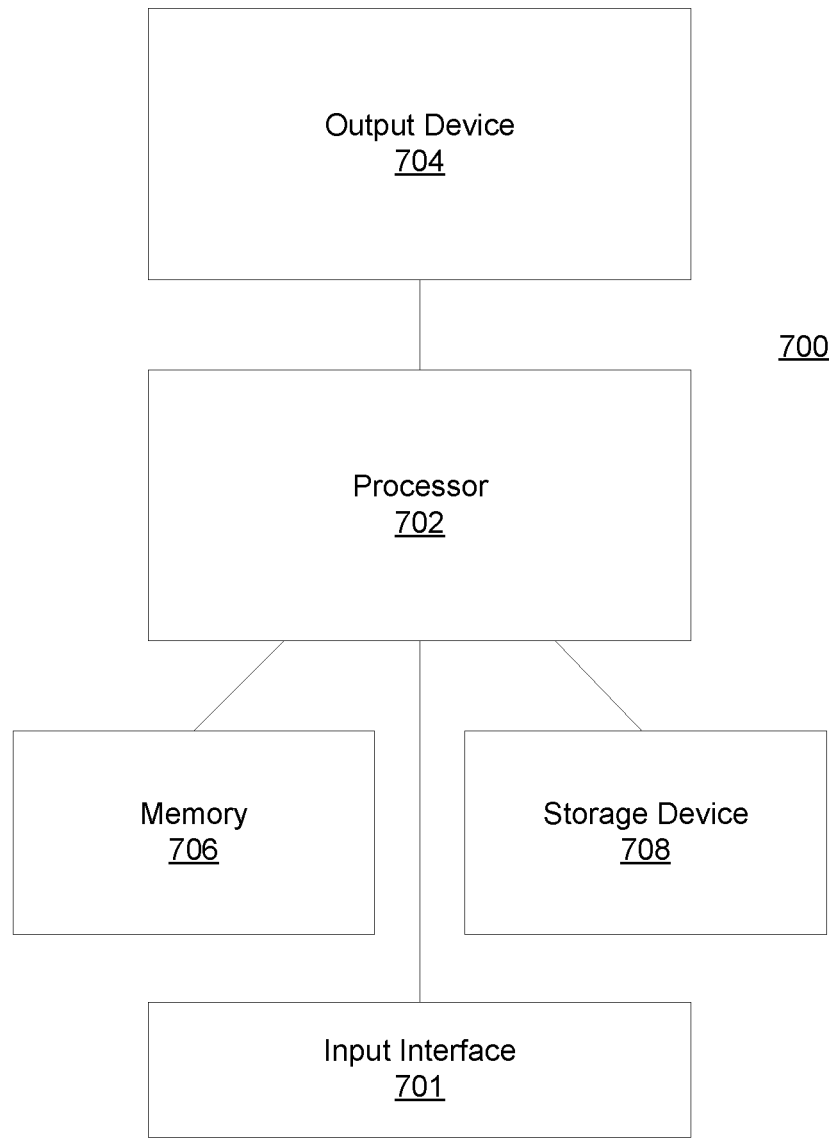
FIG. 7 is a system for emulating an image processing system according to some embodiments of the present invention.

FIG. 7 is a system for emulating an image processing system according to some embodiments of the present invention. System 700 may include a processor 702 (e.g. single processor or a processing unit made that includes a plurality of processors, on a single machine or distributed on a plurality of machines) for executing a method according to some embodiments of the present invention. Processing unit 702 may be configured to perform a method according to some embodiments of the invention and perform other actions and processing according to some embodiments of the present invention.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for performing verification of an image processing system, the method comprising:
   in an off-line process, pre-processing image files by converting each of the image files to a file of low-level image data packets;
   verifying the image processing system, by:
      emulating the image processing system on an emulator;
      loading each of the files of low-level image data packets to a memory of the emulator;
      reading, by the emulator, each of the loaded files from the memory; and
      streaming, by the emulator, each of the read files of low-level image data packets to the emulated image processing system.

2. The method of claim 1, wherein the pre-processing of the image files is performed by software running on a workstation.

3. The method of claim 2, wherein the software is a simulation computer program.

4. The method of claim 1, wherein the image files include image files of one or a plurality of image file formats.

5. The method of claim 4, wherein said one or a plurality of image file formats are selected from the group of image file formats consisting of raster formats or vector formats.

6. The method of claim 5, wherein the raster formats or vector formats are selected form the group consisting of: RAW, YUV, JPEG, Exif, TIFF, GIF, BMP, PNG, PPM, PGM, PBM, PNM, WebP, HDR, HEIF, BAT, BPG, CGM, Gerber format, and SVG.

7. The method of claim 1, wherein the loading the files of low-level image data packets to the memory of the emulator, reading each of the files of the low-level image data packets from the memory and streaming the read to the emulated image processing system is performed by a verification IP.

8. The method of claim 7, wherein the verification IP is an accelerated verification IP.

9. The method of claim 1, wherein the pre-processing of the image files comprises:
   identifying a file format for an image file of said the image files;
   processing that image file by an engine corresponding to the identified file format;
   generating the low-level image data packets for that image file.

10. The method of claim 9, wherein identifying the file format comprises using a Simple Directmedia Level (SDL) Application Programming Interface (API).

11. The method of claim 9, further comprising forwarding the generated low-level image data packets for that image file to Register Transfer Level (RTL) memory or to an Accelerated Verification IP (AVIP).

12. A system for performing verification of an image processing system, the system comprising:
   memory; and
   one or more processors configured to:
      in an off-line process, pre-process image files by converting each of the image files to a file of low-level image data packets;
      verify the image processing system, by:
         emulating the image processing system;
         loading each of the files of low-level image data packets to the memory;
         reading the loaded file from the memory; and
         streaming each of the read files of low-level image data packets to the emulated image processing system.

13. The system of claim 12, comprising a workstation and an emulator.

14. The system of claim 13, wherein the workstation is configured to pre-process the image files.

15. The system of claim 14, wherein the image files include image files of one or a plurality of image file formats.

16. The system of claim 15, wherein said one or a plurality of image file formats are selected from the group of image file formats consisting of raster formats or vector formats.

17. The system of claim 16, wherein the raster formats or vector formats are selected form the group consisting of: RAW, YUV, JPEG, Exif, TIFF, GIF, BMP, PNG, PPM, PGM, PBM, PNM, WebP, HDR, HEIF, BAT, BPG, CGM, Gerber format, and SVG.

18. A non-transitory computer readable storage medium for performing verification of an image processing system, having stored thereon instructions that when executed by a processor will cause the processor to:
   in an off-line process, pre-process image files by converting each of the image files to a file of low-level image data packets;
   verify the image processing system, by:
      emulating the image processing system on an emulator;
      loading each of the files of low-level image data packets to a memory of the emulator;
      reading, by the emulator, the loaded file from the memory; and
      streaming, by the emulator, each of the read files of low-level image data packets to the emulated image processing system.

19. The non-transitory computer readable storage medium of claim 18, wherein the image file format is are selected form the group consisting of: RAW, YUV, JPEG, Exif, TIFF, GIF, BMP, PNG, PPM, PGM, PBM, PNM, WebP, HDR, HEIF, BAT, BPG, CGM, Gerber format, and SVG.

20. The non-transitory computer readable storage medium of claim 18, wherein the loading the files of low-level image data packets to the memory of the emulator, reading each of the files of the low-level image data packets from the memory and streaming the read to the emulated image processing system is performed by a verification IP.

* * * * *